(12) United States Patent
Purdy et al.

(10) Patent No.: US 12,091,601 B2
(45) Date of Patent: Sep. 17, 2024

(54) PROCESS TO MANUFACTURE NOVEL INHIBITED HYDROFLUORIC ACID COMPOSITION

(71) Applicant: FLUID ENERGY GROUP LTD., Calgary (CA)

(72) Inventors: Clay Purdy, Medicine Hat (CA); Markus Weissenberger, Calgary (CA); Karl W. Dawson, Calgary (CA); Kyle G. Wynnyk, Calgary (CA)

(73) Assignee: Dorf Ketal Chemicals FZE, Fujairah (AE)

( * ) Notice: Subject to any disclaimer, the term of this patent is extended or adjusted under 35 U.S.C. 154(b) by 0 days.

(21) Appl. No.: 17/987,004

(22) Filed: Nov. 15, 2022

(65) Prior Publication Data
US 2023/0080049 A1 Mar. 16, 2023

Related U.S. Application Data

(62) Division of application No. 17/338,865, filed on Jun. 4, 2021, now Pat. No. 11,525,085.

(30) Foreign Application Priority Data

Jun. 12, 2020 (CA) .................................. CA 3083522

(51) Int. Cl.
  *C09K 13/08* (2006.01)
  *C09K 13/06* (2006.01)
  *H01L 21/306* (2006.01)

(52) U.S. Cl.
  CPC .............. *C09K 13/08* (2013.01); *C09K 13/06* (2013.01); *H01L 21/30604* (2013.01)

(58) Field of Classification Search
  None
  See application file for complete search history.

(56) References Cited

U.S. PATENT DOCUMENTS

| 8,389,453 | B2 | 3/2013 | Thomson |
| 10,035,949 | B2 | 7/2018 | Gill et al. |
| 11,370,961 | B2 * | 6/2022 | Purdy .................... C09K 17/40 |
| 2007/0251551 | A1 * | 11/2007 | Korzenski ......... H01L 21/31133 |
| | | | 257/E21.255 |
| 2008/0125342 | A1 | 5/2008 | Visintin et al. |
| 2008/0242574 | A1 | 10/2008 | Rath et al. |
| 2012/0009788 | A1 * | 1/2012 | Liu ................... H01L 21/76814 |
| | | | 134/28 |
| 2013/0217234 | A1 * | 8/2013 | Liu ....................... C11D 3/3953 |
| | | | 134/3 |
| 2016/0010035 | A1 * | 1/2016 | Liu ..................... C11D 11/0047 |
| | | | 510/175 |
| 2018/0105774 | A1 * | 4/2018 | Inaoka .............. H01L 21/02074 |
| 2020/0317516 | A1 * | 10/2020 | Purdy .................... C03C 15/02 |

FOREIGN PATENT DOCUMENTS

WO 2016033259 A1 3/2016

* cited by examiner

*Primary Examiner* — Allan W. Olsen
(74) *Attorney, Agent, or Firm* — Blank Rome LLP

(57) ABSTRACT

A process for controlling the heat generated during the manufacture an inhibited hydrofluoric acid aqueous composition comprising:
  hydrofluoric acid in solution;
  a weak base; and
  an alkanolamine;
said process comprising the steps of:
  providing a pre-determined amount of weak base;
  adding a pre-determined amount of said hydrofluoric acid to said weak base and obtaining a solution;
  adding said alkanolamine to the resulting solution of hydrofluoric acid and weak base;
  mixing until all components are dissolved;
wherein said alkanolamine and hydrofluoric acid are present in a molar ratio of at least 1:1.

20 Claims, No Drawings

PROCESS TO MANUFACTURE NOVEL INHIBITED HYDROFLUORIC ACID COMPOSITION

CROSS REFERENCE TO RELATED APPLICATIONS

This application is a divisional of U.S. Non-Provisional application Ser. No. 17/338,865, filed Jun. 4, 2021, which claims the benefit of Canada Application No. 3,083,522 filed Jun. 12, 2020, the entire contents of which are incorporated by reference herein.

FIELD OF THE INVENTION

The present invention is directed to a process to prepare a novel acid composition for use in various industries, more specifically it is directed to a process to yield an inhibited hydrofluoric acid (HF) and the use of such as a mud acid or more directly to provide a safer, technical advanced alternative to hydrofluoric-hydrochloric acid.

BACKGROUND OF THE INVENTION

Acids have numerous applications across most all industries. The use of acids requires certain safety precautions. All acids are not created equal, some are mundane and are found in almost every household, e.g., vinegar. Other acids are highly controlled to avoid major releases, which can cause serious environmental and human exposure consequences.

Hydrofluoric acid, while not a strong acid, i.e., does not dissociate fully in water, is classified as one of the most dangerous substances used in industry. Even small amounts of dermal exposure can result in organ failure and death.

Hydrofluoric acid is a solution of hydrogen fluoride (HF) and water. It is used in the preparation of almost all fluorine compounds, such as polymers. It is a highly-corrosive colourless solution that is capable of dissolving a large number of materials, such as glass (silica) and various metals. Because it is highly reactive to glass and corrosive to various metals, it must be stored in plastic containment vessels or other non-reactive materials. As a gas (fumes), hydrogen fluoride is poisonous and can quickly and irreversibly damage soft tissues such as lungs and the corneas of the eyes. Aqueous hydrofluoric acid is a contact-poison with the potential for deep burns that, although initially painless, result in tissue death. By interfering with the body's calcium metabolism, the concentrated acid may also cause systemic toxicity and eventual cardiac arrest and fatality.

Its widespread use warrants the demand for a safer form of HF to allow handling, storage and transport thereof without the constant major negative risks and costs associated with such, and desirably perhaps a reduction of the handling, storage and transportation restrictions and requirements.

Prior art, while abundant in its use of HF for various applications, does not provide any indication of an effective, commercially viable, safe alternative for the handling of HF. One can immediately see the value of a safer to handle composition of HF given the multiple applications in multiple industries.

U.S. Pat. No. 8,389,453 teaches a tetrafluoroboric acid and an organic nitrogenous base, related compounds and compositions, can be used in conjunction with various methods of cleaning and/or the treatment of substrate surfaces. It specifically discloses a method for removing surface contaminants, said method comprising: providing an aqueous composition comprising a compound, said compound the acid-base reaction product of tetrafluoroboric acid and urea, said urea and said tetrafluoroboric acid in a molar ratio of about 1.0 to about 3.0, said urea utilized as a base and dissolved in said composition; and contacting said composition and a surface comprising at least one contaminant thereon.

WO2016033259A1 teaches methods for removing and inhibiting deposits, reducing the pH of aqueous mixtures, and increasing recovery of crude oil from subterranean formations, the methods comprising contacting an acid composition with a liquid that is in contact with a metal surface or with a well or formation. The composition comprises a salt of a nitrogen base having a fluoro-inorganic anion. In particular, these methods are intended for removing deposits and lowering the pH. These methods can be used in steam generators, evaporators, heat exchangers, and the like that use water compositions containing produced water and other water sources in plant unit operations.

U.S. Pat. No. 10,035,949 B2 teaches methods for increasing recovery of crude oil from a subterranean hydrocarbon-containing formation and for removing or inhibiting deposits in a well, the methods comprising contacting an acid composition that comprises a salt of a nitrogen base having a fluoro-inorganic anion with the well or the formation.

Also known is tetrafluoroboric acid with the chemical formula $H_3OBF_4$. It is mainly produced as a precursor to fluoroborate salts. It is a strong acid and quite corrosive as it attacks the skin. It is available commercially as a solution in water and other solvents such as diethyl ether. In oil and gas applications it is considered to be a retarded acid which permits deep penetration into the reservoir before the acid is spent, i.e., fully reacted with the formation. For a solution of tetrafluoroboric acid, at no point in time is there a high amount of free HF, making it less reactive than common mud acids. Because of its long reaction time, tetrafluoroboric acid treatments require longer shut-in times compared to common mud acid or HF treatments making them less attractive due to operational restrictions.

In light of the prior art, there remains a need to produce a more HS&E orientated, technically advanced mud acid system and method of using such. The known uses have undeniable value in various industries but the health and environment risks, and technically negative aspects associated with its use, are many and considerable.

SUMMARY OF THE INVENTION

According to an aspect of the present invention, there is provided a process for controlling the heat generated during the manufacture of an inhibited hydrofluoric acid aqueous composition comprising:
  hydrofluoric acid in solution;
  a weak base; and
  an alkanolamine;
said process comprising the steps of:
  providing a pre-determined amount of weak base;
  adding a pre-determined amount of said hydrofluoric acid to said weak base and obtaining a solution;
  adding said alkanolamine to the resulting solution of hydrofluoric acid and weak base;
  mixing until all components are dissolved;
wherein said alkanolamine and hydrofluoric acid are present in a molar ratio of at least 1:1.

Preferably, the weak base is in solution prior to adding the hydrofluoric acid.

Preferably, said alkanolamine and hydrofluoric acid are present in a molar ratio of at least 1.1:1.

According to a preferred embodiment, the alkanolamine is selected from the group consisting of: monoethanolamine; diethanolamine; triethanolamine and combinations thereof. Preferably, the alkanolamine is monoethanolamine. According to a preferred embodiment, the alkanolamine is diethanolamine. According to another preferred embodiment, the alkanolamine is triethanolamine.

According to a preferred embodiment, the weak base is selected from the group consisting of: lysine; triazole; imidazole; hydantoin; n-methylimidazole; and triethanolamine. Preferably, the weak base is imidazole.

According to a preferred embodiment, the weak base is present in an amount ranging from 0.02 to 0.5 moles for each mole of HF present.

According to a preferred embodiment, the weak base is present in an amount ranging from 0.05 to 0.2 moles for each mole of HF present.

DESCRIPTION OF EMBODIMENTS OF THE PRESENT INVENTION

Example 1—Inhibited HF Composition

An inhibited HF composition can be made by the addition of at least 1 molar equivalent of an alkanolamine, such as monoethanolamine (MEA). Preferably, a safety factor of 10% is used, so 1.1 molar equivalents of MEA are added to 1 mole of HF. The subsequent addition of an acid to the inhibited HF composition restores the inhibited HF's ability to dissolve sand, and it has a similar dissolving power to a regular mud acid.

Preferably, the inhibited HF is understood to eliminate the fatal skin contact hazard, however, 5.7% of the MEA remains unreacted, resulting in a solution that is approximately pH 9, and may still carry some skin irritation issues.

Preferably, an inhibited acid should be effective at dissolving metal oxides (especially aluminum oxide) as well as complex silicates. Other desirable properties include: the ability to rapidly solubilize iron oxides and calcium based scales.

Inhibition of HF

HF was inhibited by the addition of monoethanolamine (MEA), until no quartz ($SiO_2$) was dissolved. A molar ratio of 1 MEA to HF or greater is necessary to inhibit HF's ability to dissolve quartz, and a ratio of 1.1 will used in further testing to provide a reasonable safety margin.

It is assumed that at a ratio of 1.1, the hazard for skin contact of the solution has been eliminated. Although, the excess MEA (5.7%) present may also still be somewhat damaging to the skin as the pH is still relatively high (8.5 to 9.5).

Re-Activation of the Inhibited HF Composition

The inhibited HF solution can regain its quartz dissolving potential through the addition of an acidic solution, such as HCl. By themselves, HCl or inhibited HF dissolve essentially no quartz; however, in combination they perform on par with a normal mud acid (HF:HCl).

To evaluate the performance of mud acids created with acid compositions comprising HCl:MEA in ratios of 4.4:1; 6.3:1; and 11.3:1, inhibited HF mud acids were prepared using HCl and acid compositions comprising HCl:MEA in ratios of 4.4:1; and 11.3:1 with various amount of free HCl (6 to 12%). The results show that mud acids produced with acid compositions comprising HCl:MEA in ratios of 4.3:1; and 11.3:1 match, and may even exceed, the performance of a standard HCl mud acid.

Effects of Mud Acid Compositions Comprising HCl:MEA in Ratios of 4.1:1; 6.4:1; and 9.9:1 on Reprecipitation Three types of reprecipitation products are commonly known to occur during sandstone acidizing, and are referred to as primary, secondary, and tertiary reaction products.

Primary precipitation products can occur between HF and calcium (from $CaCO_3$) to produce calcium fluoride as per equation (1):

$$2HF_{(aq)} + CaCO_3(s) \rightarrow CaF_2(s) + CO_2(g) + H_2O(l) \tag{1}$$

The precipitation will occur when the concentration of $CaF_2$ exceeds 0.16 g/L. This reaction is avoided by using an acidic pre-flush to clean the near-wellbore region, and the inhibited HF combined with HCl for example, will not prevent this reaction if calcium is present.

Secondary precipitation products are those that occur as a result of a reaction with hexafluorosilicic acid ($H_2SiF_6$), which is produced when HF reacts with quartz as shown in equation 2, or with clay (general formula of Al—Si) as shown in equation 4:

$$6HF(aq) + SiO_2(s) \rightarrow H_2SiF_6(aq) + 2H_2O(l) \tag{2}$$

$$(6+x)HF(aq) + Al—Si(s) \rightarrow H_2SiF_6(aq) + AlF_x^{(3-x)+}(aq) \tag{3}$$

Hexafluorosilicic acid can react with alkali metals ($M^t$), typically sodium or potassium, to produce hexafluorosilicate precipitates as per equation 4:

$$H_2SiF_6(aq) + 2M^+(aq) \rightarrow M_2SiF_6(s) + 2H^+(aq) \tag{4}$$

The precipitation will occur when the concentration exceeds 6.4 g/L for $Na_2SiF_6$, and 1.8 g/L for $K_2SiF_6$. The inhibited mud acid discussed herein was not expected to prevent this precipitation, and laboratory trials demonstrate that similar amounts of potassium hexafluorosilicate were precipitated in comparison to a standard mud acid.

Hexafluorosilicic acid can also react with the aluminum in clays to produce a silica gel precipitate as shown in equation 5 (unbalanced):

$$H_2SiF_6(aq) + Al^{3+}(s) \rightarrow AlF_x^{(3-x)+}(aq) + SiO_2(s) + H^+(aq) \tag{5}$$

This reaction is reported to occur slowly at temperatures below 50° C., but rapidly at higher temperatures. When dissolving Kaolinite clay ($Al_2Si_2O_5[OH]_4$), laboratory tests found no difference in the amount of dissolved material when comparing a standard mud acid to an inhibited mud acid made with an acid composition comprising HCl:MEA in a ratio of 11.3:1, demonstrating that this type of inhibited composition is as effective as conventional systems while providing many storage, environmental and handling advantages.

The aluminum fluoride produced in equation 5 (also equation 3) can also precipitate above pH 2.5 to 3 if there is a high F/Al ratio, but the solubility of $AlF_3$ is relatively high at 56 g/L.

Tertiary precipitation products are those that occur as a result of a reaction of the aluminum fluorides produced in equations 3 and 5 continuing to react with clays to produce a silica gel precipitate as shown in equation 6 (unbalanced):

$$y\ AlF_x^{(3-x)+}(aq) + (x-y)Al—Si(s) + H^+(aq) \rightarrow x\ AlF_x^{(3-x)+}(aq) + (x-y)SiO_2(s) \tag{6}$$

This tertiary reaction only occurs slowly at temperatures below 95° C., and is understood to produces essentially the same precipitates as the secondary reaction products in equation 5.

Mud Acid Ratio Limitations Using Acid Composition of HCl:MEA in Ratios of 4.4:1; 6.3:1; and 11.3:1 and Inhibited HF Mud acids typically contain HF at concentrations of 0.5 to 3% by mass, and HCl at 4 to 15% by mass. By using acids with an enhanced HSE profile, such as HCl:MEA (in a ratio of 4.4:1), rather than 15% HCl, the additional MEA inhibitor will limit the amount of free HCl available in solution.

According to another embodiment of the present invention, a few common high HCl:HF ratios, such as 12:3 and 10:2, are not possible using HCl:MEA (in a ratio of 4.4:1) and inhibited HF; to achieve these higher strength mud acids, HCl:MEA blends with lower HSE performance (where the HCl:MEA ratios are 6.3:1; and 11.3:1, for example) may be required.

According to a preferred embodiment of the present invention, the composition can be used in oil refining (as an acid catalyst in a standard oil refinery process). According to another preferred embodiment of the present invention, the composition can be used in the production of organofluorine compounds including: Teflon®, fluorocarbons, fluoropolymers and refrigerants like freon. According to yet another preferred embodiment of the present invention, the composition can be used in the production of fluoride compounds such as cryolite and aluminium trifluoride to name but a few examples. According to another preferred embodiment of the present invention, the composition can be used as a pickling and cleaning agent in metalworking. It has a great ability to remove oxides and other impurities from carbon steels and stainless steel. According to yet another preferred embodiment of the present invention, the composition can be used, upon dilution, as a household or industrial rust stain remover or aluminum or other appropriate metal brightener.

Dermal Toxicity

LD50 Test

HF is an acute dermal toxin, with an LD50 of between 401 and 802 mg/kg in rats. To determine the dermal toxicity of the composition of Example 1, a sample was sent to a $3^{rd}$ party independent lab (STILLMEADOW, Inc.) to determine the acute dermal toxicity of the material. The study found that the acute dermal toxicity LD50 for a composition of MEA:HF in a molar ratio of 1.1:1 on albino rats was greater than 5,050 mg/kg (Study ID 22094-18), which is well above the 2,000 mg/kg limit for a material to be considered a potential acute dermal toxin.

Department of Transportation (DOT) Test

The composition of Example 1 was tested for skin corrosiveness using the DOT criteria when applied to intact skin of albino rabbits.

The original animal was treated with 0.5 mL of undiluted test material, to permit predetermined observation times of treated sites for dermal irritation and defects. The first site dosed was washed and observed 3 minutes later. A second site was dosed and wrapped for 1 hour, then washed; both first and second test sites were observed. A third site dosed was wrapped for 4 hours. One hour after unwrapping and washing the third site, all three test sites were observed for signs of skin irritation and/or corrosion. Based on results of the first dosed animal, each of two additional animals were then dosed on a single intact 4-hour test site. Observations of all animals for dermal irritation and defects were made at ~1, 24, 48 and 72 hours, and (original animal only) 7, 10 and 14 days after the 4-hour dose unwrap.

Tissue destruction (indication of necrosis/ulceration) was not observed in any animal at any time during the study. The test material is considered non-corrosive by DOT criteria when applied to intact skin of albino rabbits.

Dermal irritation (according to OECD 404 Test procedure) was observed in one animal for the primary skin irritation segment of the test. A Primary Irritation Index (PII) of 0.4 was obtained based on 1, 24, 48 and 72-hour observations (4-hour exposure site only) for irritation, and that value used to assign a descriptive rating of slightly irritating.

Minimizing the Heat Generated by the Inhibition Reaction

The inhibited HF acid prepared in Example 1 generated a heat of reaction of 75.0 kJ/mol during its preparation. While the end product is very valuable because of its numerous substantial advantages, it was found to be desirable to attempt to minimize the exothermicity of the process in order to increase the safety aspect of its preparation.

Consequently, various compositions were tested to determine if the exothermic character of the inhibition of the HF by the addition of monoethanolamine can be diminished to make the preparation of such an easier process to implement.

The addition of weak bases such as lysine, triazole, imidazole, hydantoin, diethanolamine and triethanolamine to HF and monoethanolamine was tested in order to assess if there was a way to control the exothermic character of the reaction.

The weak bases were added in an amount of 0.05 mole to 1.0 mole of HF. Then 1.0 mole MEA was added to the solution. The heat of reaction of the MEOA addition to the HF-weak base composition was recorded and is listed in Table 1 below.

TABLE 1

Heat of reaction of 1.00 HF: 1.00 MEA: 0.05 Weak base (WB) in mol ratio

| Weak base | Molar Mass (g/mol) | Heat of reaction (kJ/mol) | Reduction (kJ reduction/g weak base added) |
|---|---|---|---|
| Lysine | 146.19 | 42.8 | 4.4 |
| Triazole | 69.07 | 63.1 | 3.5 |
| Imidazole | 68.08 | 55.9 | 5.6 |
| Hydantoin | 100.07 | 60.3 | 2.9 |
| Triethanolamine | 149.19 | 64.3 | 1.6 |

According to the data above, each weak base provided some tempering of the exothermic character of the reaction of HE with monoethanolamine as described previously. As such, each one could provide some advantage to the preparation of inhibited HF. Preferably, imidazole provided more advantages than the other weak bases. According to another preferred embodiment of the present invention, the inhibitor is n-methylimidazole.

pH Summary

The pH of the compositions was determined for a 1:1:0.1 molar ratio composition of HF:MEA:weak base. The results are listed in Table 2 below.

TABLE 2 pH of various compositions having the following content 1.00 HF: 1.00 MEA: 0.10 weak base

| Weak Base | Molar Mass (g/mol) | pH | T (° C.) |
|---|---|---|---|
| Lysine | 146.19 | Solid | — |
| Triazole | 69.07 | 8.48 | 20.4 |
| Imidazole | 68.08 | 7.36 | 20.1 |
| Hydantoin | 100.07 | 8.67 | 20.0 |
| Triethanolamine | 149.19 | 7.88 | 20.2 |

Experimental Observations:

Some observations made during the testing include: imidazole forms an Imidazole-HF salt at a 1:1 molar ratio; lysine forms a Lysine-HF salt at a molar ratio of greater than 0.2:1 molar ratio; hydantoin forms a Hydantoin-HF salt at a molar ratio of greater than 0.5:1 molar ratio; a combination of MEA and glycine was found to have a pH below seven at a molar ration of 1.0:0.1:1.0 MEA-Glycine-HF and therefore HF was not completely inhibited.

The testing indicates that imidazole reduces the enthalpy by the greatest amount. The reduction per mass of weak base added was the most important parameter considered. The largest reduction is imidazole with a 5.6 kJ reduction/g weak based added. Followed by triazole and hydantoin.

The addition of imidazole had no observable color change on the final composition. The compositions comprising triazole and hydantoin (separately) did display a very slight color change.

Enthalpy changes of neutralization are always negative, heat is released when an acid and alkali react. For reactions involving strong acids and alkalis, the values are always very closely similar, with values between −57 and −58 kJ mol$^{-1}$.

Reactivity Testing

Two sets of experiments of experiments were carried out to assess the reactivity of various HF containing compositions.

All blends were made to have a 12 wt % HCl and 3 wt % HF concentrations. The source of HF was one of 50 wt % HF, inhibited HF (imidazole) with a molar ratio of 10:10:1 hydrogen fluoride:monoethanolamine:imidazole, or inhibited HF (teoa) with a molar ratio of 10:10:1 hydrogen fluoride:monoethanolamine:triethanolamine. The source of HCl was 22 baume HCl (36%). Water was used to dilute where appropriate. For all experiments Sand, white quartz cas #14808-60-7 was used.

The first set of experiments was completed at t=4 hrs at T=75° C., the results are reported in Table 3 below. The purpose is to assess the immediate reactivity of the various compositions with respect to the substrate of interest (quartz).

TABLE 3

Evaluation of the quartz sand dissolving power of various compositions over a period of 4 hours at 75° C.

| Blend | Dissolved (mg sand/ 100 g solution) |
|---|---|
| HF | 356.2 |
| Inhibited HF (imidazole) | 180.2 |
| Inhibited HF (teoa) | 256.2 |

A second set of experiments was completed at t=72 hrs at ambient conditions. In order to assess the extent of dissolution of each one of the compositions tested.

TABLE 4

Evaluation of the quartz sand dissolving power of various compositions over a period of 24 hours at ambient temperature

| Blend | Dissolved (mg sand/ 100 g solution) |
|---|---|
| HF | 1104.2 |
| Inhibited HF (imidazole) | 1043.8 |
| Inhibited HF (teoa) | 1068.4 |

In light of the testing data obtained, the total solubility of the blends (experimental results set out in table 4) is equivalent at equivalent concentration of HF (as expected). The inhibited HF blends containing imidazole and teoa substantially retarded the reactivity (see experimental results set out in table 3). This is an indication where the use of such composition could offer a technical advantage and prevent near wellbore damage. Moreover, such a retarding effect can be employed in various other industries which employ HF acidic compositions.

For example, solutions of HF are widely used industrially as etchants for glass and in the electronic industry. Specifically, the printing of electronic circuit boards utilizes HF as an etchant, where HF is one of the few etchants with an appreciable reactivity rate towards silicon dioxide and silicon nitride. In many cases, the etching rate of HF is too fast or the etching is unselective. Both cases are undesirable. Due to the negative outcomes of HF etching rate, there is a desire for blends of HF and HF/HCl that have slower and more controlled reaction rates.

According to one aspect of the present invention, there is provided an inhibited hydrofluoric acid aqueous composition comprising:

hydrofluoric acid in solution;
a weak base; and
an alkanolamine;

for use with a mineral acid such as HCl, as an etching composition in the semiconductor industry. Preferably, the molar ratio of weak base and alkanolamine to hydrofluoric acid in the composition is at least 1:1. Preferably, the molar ratio of weak base and alkanolamine to hydrofluoric acid in the composition is at least 1.05:1. Even more preferably, the molar ratio of weak base and alkanolamine to hydrofluoric acid in the composition is at least 1.1:1. Preferably, such compositions provide more control and less immediate reactivity to the substrate and therefore allow for a safer and manageable etching process.

According to another aspect of the present invention, there is provided an inhibited hydrofluoric acid aqueous composition comprising:

hydrofluoric acid in solution;
a weak base; and
an alkanolamine;

for use with a mineral acid such as HCl, as etching composition for use in etching glass such as lenses and other applications where optical glass is employed. Preferably, the molar ratio of weak base and alkanolamine to hydrofluoric acid in the composition is at least 1:1. Preferably, the molar ratio of weak base and alkanolamine to hydrofluoric acid in the composition is at least 1.05:1. Even more preferably, the molar ratio of weak base and alkanolamine to hydrofluoric acid in the composition is at least 1.1:1.

While the foregoing invention has been described in some detail for purposes of clarity and understanding, it will be appreciated by those skilled in the relevant arts, once they have been made familiar with this disclosure that various changes in form and detail can be made without departing from the true scope of the invention in the appended claims.

The invention claimed is:

1. An inhibited hydrofluoric acid aqueous composition comprising:
   hydrofluoric acid in solution;
   a weak base; and
   an alkanolamine;
   wherein the molar ratio of weak base and alkanolamine to hydrofluoric acid in the composition is at least 1:1, and wherein the composition is produced by a process comprising:
combining a pre-determined amount of hydrofluoric acid with a predetermined amount of the weak base to obtain a first solution;
adding a predetermined amount of the alkanolamine to the first solution to obtain a second solution; and
mixing the second solution to form the inhibited hydrofluoric acid aqueous composition;
wherein the process is performed such that the inhibited hydrofluoric acid aqueous composition has an HF:alkanolamine:weak base ratio ranging from 1:1:0.02 to 1:1:0.5.

2. The inhibited hydrofluoric acid aqueous composition of claim 1, wherein the molar ratio of weak base and alkanolamine to hydrofluoric acid in the composition is at least 1.05:1.

3. The inhibited hydrofluoric acid aqueous composition of claim 1, wherein the molar ratio of weak base and alkanolamine to hydrofluoric acid in the composition is at least 1.1:1.

4. The inhibited hydrofluoric acid aqueous composition of claim 1, wherein the alkanolamine is selected from the group consisting of monoethanolamine, diethanolamine, triethanolamine, and any combination thereof.

5. The inhibited hydrofluoric acid aqueous composition of claim 1, wherein the alkanolamine is monoethanolamine.

6. The inhibited hydrofluoric acid aqueous composition of claim 1, wherein the alkanolamine is diethanolamine.

7. The inhibited hydrofluoric acid aqueous composition of claim 1, wherein the alkanolamine is triethanolamine.

8. The inhibited hydrofluoric acid aqueous composition of claim 1, wherein the weak base is selected from the group consisting of lysine, triazole, imidazole, hydantoin, and n-methylimidazole.

9. The inhibited hydrofluoric acid aqueous composition of claim 1, wherein the weak base is imidazole.

10. The inhibited hydrofluoric acid aqueous composition of claim 1, wherein the weak base is present in an amount ranging from 0.05 to 0.2 moles for each mole of HF present.

11. The inhibited hydrofluoric acid aqueous composition of claim 1, wherein the process is performed such that the inhibited hydrofluoric acid aqueous composition has an HF:alkanolamine:weak base ratio ranging from 1:1:0.05 to 1:1:0.1.

12. A glass etching composition comprising:
an inhibited hydrofluoric acid aqueous composition according to claim 1; and
a mineral acid.

13. The glass etching composition of claim 12, wherein the mineral acid is HCl.

14. The glass etching composition of claim 12, wherein
the alkanolamine is selected from the group consisting of monoethanolamine, diethanolamine, triethanolamine, and any combination thereof; and
the weak base is selected from the group consisting of lysine, triazole, imidazole, hydantoin, and n-methylimidazole.

15. An inhibited hydrofluoric acid aqueous composition comprising:
hydrofluoric acid in solution;
a weak base; and
an alkanolamine;
wherein the molar ratio of weak base and alkanolamine to hydrofluoric acid in the composition is at least 1:1, and
wherein the composition is produced by a process comprising:
preparing a first solution comprising a weak base;
combining a pre-determined amount of hydrofluoric acid with the first solution to obtain a second solution;
adding a predetermined amount of the alkanolamine to the second solution to obtain a third solution; and
mixing the third solution to form the inhibited hydrofluoric acid aqueous composition,
wherein the process is performed such that the inhibited hydrofluoric acid aqueous composition has an HF:alkanolamine:weak base ratio ranging from 1:1:0.02 to 1:1:0.5.

16. The inhibited hydrofluoric acid aqueous composition of claim 15, wherein the process is performed such that the inhibited hydrofluoric acid aqueous composition has an HF:alkanolamine:weak base ratio ranging from 1:1:0.05 to 1:1:0.1.

17. the inhibited hydrofluoric acid aqueous composition of claim 15, wherein the alkanolamine is selected from the group consisting of monoethanolamine, diethanolamine, triethanolamine, and any combination thereof.

18. The inhibited hydrofluoric acid aqueous composition of claim 15, wherein the weak base is selected form the group consisting of lysine, triazole, imidazole, hydantoin, and n-methylimidazole.

19. A glass etching composition comprising:
an inhibited hydrofluoric acid aqueous composition according to claim 15, and
a mineral acid.

20. The glass etching composition of claim 19, wherein
the mineral acid is HCl;
the alkanolamine is selected form the group consisting of monoethanolamine, diethanolamine, triethanolamine, and any combination thereof; and
the weak base is selected from the group consisting of lysine, triazole, imidazole, hydantoin, and n-methylimidazole.

* * * * *